(12) United States Patent
Abdallah et al.

(10) Patent No.: US 8,859,433 B2
(45) Date of Patent: Oct. 14, 2014

(54) DSA GRAPHO-EPITAXY PROCESS WITH ETCH STOP MATERIAL

(71) Applicant: International Business Machines Corporation, Armonk, NY (US)

(72) Inventors: Jassem A. Abdallah, Albany, NY (US); Matthew E. Colburn, Schenectady, NY (US); Steven J. Holmes, Albany, NY (US); Daiji Kawamura, Albany, NY (US); Chi-Chun Liu, Albany, NY (US); Muthumanickam Sankarapandian, Schenectady, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 13/793,739

(22) Filed: Mar. 11, 2013

(65) Prior Publication Data

US 2014/0256145 A1    Sep. 11, 2014

(51) Int. Cl.
*H01L 21/00* (2006.01)
*H01L 21/308* (2006.01)

(52) U.S. Cl.
CPC .................................. *H01L 21/308* (2013.01)
USPC ................................... 438/725; 257/E21.024

(58) Field of Classification Search
None
See application file for complete search history.

(56) References Cited

U.S. PATENT DOCUMENTS

| | | | |
|---|---|---|---|
| 7,914,975 B2 | 3/2011 | Burns et al. | |
| 8,008,200 B2 | 8/2011 | Jiang et al. | |
| 8,114,306 B2 | 2/2012 | Cheng et al. | |
| 8,129,286 B2* | 3/2012 | Edelstein et al. | 438/733 |
| 8,187,962 B2 | 5/2012 | Hampp | |
| 8,207,614 B2 | 6/2012 | Abatchev et al. | |
| 8,623,458 B2* | 1/2014 | Cheng et al. | 427/259 |
| 8,633,112 B2* | 1/2014 | Millward et al. | 438/700 |
| 8,641,914 B2* | 2/2014 | Regner | 216/17 |
| 8,691,925 B2* | 4/2014 | Wu et al. | 526/319 |
| 8,715,917 B2* | 5/2014 | Holmes et al. | 430/325 |
| 2009/0179002 A1* | 7/2009 | Cheng et al. | 216/41 |
| 2010/0151393 A1* | 6/2010 | Kim et al. | 430/322 |
| 2010/0167214 A1* | 7/2010 | Yoon et al. | 430/323 |
| 2011/0200795 A1 | 8/2011 | Lammers et al. | |
| 2012/0133017 A1* | 5/2012 | Millward et al. | 257/506 |
| 2012/0312501 A1* | 12/2012 | Koole et al. | 165/65 |

(Continued)

OTHER PUBLICATIONS

Han, E., et al. "Effect of Composition of Substrate-Modifying Random Copolymers on the Orientation of Symmetric and Asymmetric Diblock Copolymer Domains" Macromolecules. Nov. 2008. pp. 9090-9097.

*Primary Examiner* — Charles Garber
*Assistant Examiner* — Evren Seven
(74) *Attorney, Agent, or Firm* — Tutunjian & Bitetto, P.C.; Parashos Kalaitzis (57) ABSTRACT

A method for defining a template for directed self-assembly (DSA) materials includes forming an etch stop layer on a neutral material, forming a mask layer on the etch stop layer and forming an anti-reflection coating (ARC) on the mask layer. A resist layer is patterned on the ARC using optical lithography to form a template pattern. The ARC and the mask layer are reactive ion etched down to the etch stop layer in accordance with the template pattern to form a template structure. The ARC is removed from the mask layer and the template structure is trimmed to reduce a width of the template structure. A wet etch is performed to remove the etch stop layer to permit the neutral material to form an undamaged DSA template for DSA materials.

25 Claims, 5 Drawing Sheets

(56) References Cited

U.S. PATENT DOCUMENTS

| | | | |
|---|---|---|---|
| 2013/0034964 A1* | 2/2013 | Zhang et al. | 438/702 |
| 2013/0059438 A1* | 3/2013 | Zhou et al. | 438/689 |
| 2013/0207238 A1* | 8/2013 | Cooper et al. | 257/618 |
| 2013/0243958 A1* | 9/2013 | Senzaki et al. | 427/264 |
| 2013/0252179 A1* | 9/2013 | Senzaki et al. | 430/325 |
| 2014/0069325 A1* | 3/2014 | Kawanishi | 117/54 |
| 2014/0113236 A1* | 4/2014 | Senzaki et al. | 430/325 |
| 2014/0116980 A1* | 5/2014 | Wuister | 216/11 |

\* cited by examiner

FIG. 8

DSA GRAPHO-EPITAXY PROCESS WITH ETCH STOP MATERIAL

BACKGROUND

1. Technical Field

The present invention relates to semiconductor processing, and more particularly to methods for achieving high resolution resist structures for template formation for directed self-assembly (DSA) processing.

2. Description of the Related Art

Directed self assembly (DSA) has emerged as a useful tool in semiconductor processing. DSA includes providing two materials and polymerizing them to concurrently form the materials into separate polymer regions. By providing physical guides, mandrels or templates, the polymers can be formed into useful structures, e.g., parallel lines and the like. DSA may be employed, e.g., to form interconnect lines, spacers and/or contacts.

DSA typically requires high-resolution templates to ensure proper formation of the DSA structures. However, present techniques yield large inaccurate resist features, which cannot form high resolution mandrels. Further, metal lift-off processes from resist features require metal deposition onto a neutral material layer leading to high defect levels and high line edge roughness (LER). Employing e-beam resists to form resist patterns on top of the neutral material layer is not a manufacturable lithographic technique useful for device production.

With these techniques or potential techniques, the height and profile of the resist tends to be poor at presently achievable and useful line widths, and these techniques may result in damage to the neutral material layer needed for the formation of DSA films and other structures.

SUMMARY

A method for defining a template for directed self-assembly (DSA) materials includes forming an etch stop layer on a neutral material, forming a mask layer on the etch stop layer and forming an anti-reflection coating (ARC) on the mask layer. A resist layer is patterned on the ARC using optical lithography to form a template pattern. The ARC and the mask layer are reactive ion etched down to the etch stop layer in accordance with the template pattern to form a template structure. The ARC is removed from the mask layer and the template structure is trimmed to reduce a width of the template structure. A wet etch is performed to remove the etch stop layer to permit the neutral material to form an undamaged DSA template for DSA materials.

A method for patterning electronic structures using directed self-assembly (DSA) materials includes forming an etch stop layer on a neutral material over a substrate; forming a tri-layer lithographic mask pattern layer on the etch stop layer including an optical planarization layer (OPL), an anti-reflection coating (ARC) on the OPL and a resist layer on the ARC; developing the resist layer using optical lithography to form a template pattern on the ARC; reactive ion etching the ARC and the OPL down to the etch stop layer in accordance with the template pattern to form a template structure; removing the ARC from the OPL and trimming the template structure to reduce a width of the template structure; performing a wet etch to remove the etch stop layer performing a wet etch to remove the etch stop layer to permit the neutral material to form an undamaged DSA template; coating the neutral material with the DSA materials such that the DSA materials are enclosed between structures of the DSA template; forming different domains within the DSA materials and removing at least one of the different domains to form a DSA mask pattern; and employing the DSA mask pattern to form structures for an electronic device.

A method for patterning electronic structures using directed self-assembly (DSA) materials includes forming an etch stop layer on a neutral material over a substrate; forming a tri-layer lithographic mask pattern layer on the etch stop layer including an optical planarization layer (OPL), an anti-reflection coating (ARC) on the OPL and a resist layer on the ARC; developing the resist layer using optical lithography to form a template pattern on the ARC; reactive ion etching the ARC and the OPL down to the etch stop layer in accordance with the template pattern to form a template structure; removing the ARC from the OPL and trimming the template structure to reduce a width of the template structure wherein the template is accurately formed to permit width dimensions of 25 nm or less; performing a wet etch to remove the etch stop layer to permit the neutral material to form an undamaged DSA template wherein the wet etching includes using diluted HF, diluted to between about 800:1 to about 1200:1; coating the neutral material with the DSA materials such that the DSA materials are enclosed between structures of the DSA template; forming different domains within the DSA materials and removing at least one of the different domains to form a DSA mask pattern; and employing the DSA mask pattern to form etch the substrate to form fins for fin field effect transistors.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, devices and methods are described for providing high-resolution templates for directed self-assembly (DSA) structures. While the present embodiments will be described with respect to templates for DSA, it should be understood that the present principles may be applied to any semiconductor fabrication process. In one embodiment, a multi-layer structure employs lithography and etch stop/release layers to provide the high-resolution template. In a particularly useful embodiment, a resist layer, anti-reflection coating (ARC), an optical planarization layer (OPL) and etch stop layer are employed together to form a stack structure. The resist is lithographically patterned and employed as an etch mask to etch narrow lines (e.g., 10-20 nm) in the ARC, OPL and, eventually, the etch stop layer. The etch stop layer functions as a combined etch stop and release layer under the stack for ease of removal of patterning film without damaging a neutral material layer below the stack. The narrow lines are then employed as borders or templates for DSA material.

It is to be understood that the present invention will be described in terms of a given illustrative architecture having a wafer or substrate and multiple layers employed for DSA processing; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may be part of an integrated circuit. The design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
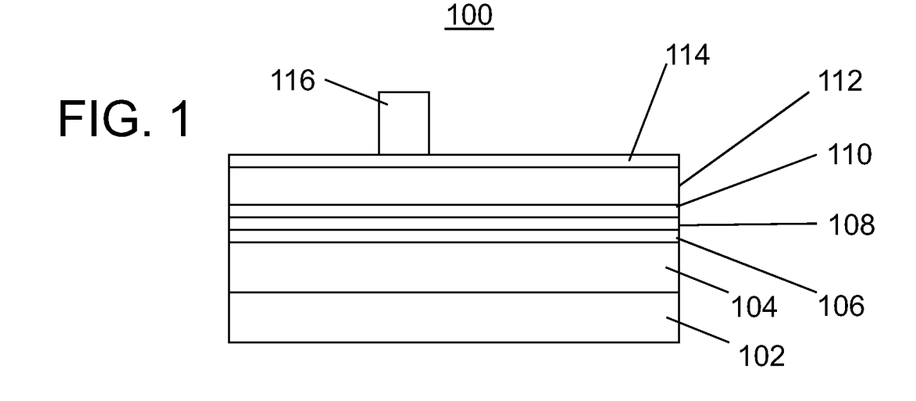
FIG. 1 is a cross-sectional view of a partially fabricated semiconductor device having a tri-layer stack with a patterned resist layer, an anti-reflection coating (ARC) and a mask layer all over an etch stop layer, which is formed on a neutral material layer in accordance with the present principles.

Referring now to the drawings in which like numerals represent the same or similar elements and initially to FIG. 1, an illustrative grapho-epitaxy flow is described in accordance with an exemplary embodiment. It should be understood that different structures, layers and materials may be employed in accordance with the present principles. To provide a high-resolution resist template (e.g., lines less than about 25 nm in width), a directed self-assembly (DSA) mandrel needs to be defined using a lithographic method that also can be easily removed using an etch stop layer that is compatible with the DSA material layer. The process creates high resolution templates for DSA, and can control the height and profile of the DSA template.

In one embodiment, a tri-layer lithographic stack is employed to ensure high resolution. A substrate 102 is provided having an optical planarization layer 104 formed thereon. The substrate 102 may include a semiconductor substrate, such as e.g., silicon, silicon germanium, germanium, GaAs, etc. The substrate 102 may be employed for forming fin field effect transistors (FINFETs) or other electronic devices, e.g., diodes, transistors, capacitors, etc. Other materials may be employed for the substrate 102 as well, e.g., ceramics, etc. depending on the application. A hard mask layer, such as an antireflection coating (ARC) 106 is formed on a mask layer 104. The ARC 106 may include Si ARC (SiARC), although other ARC layer materials may be employed. The mask layer 104 may include an optical planarization layer (OPL). OPL may be spun on and baked, or can be deposited by chemical vapor deposition (CVD). OPL can be baked at lower temperatures, such as 150-200 degrees C., to avoid damaging a neutral layer 108 by the bake process.

The neutral material layer (mat layer or, simply, mat) 108 is formed over the ARC 106. An etch stop layer 110 is formed on the neutral material layer 108. The etch selectivity is chosen for the etch stop layer 110 and the neutral material layer (neutral mat) 108 to permit selective etching relative to each other. For example, the etch stop layer 110 may include an oxide and the neutral material layer 108 may include a nitride or vice versa. In one embodiment, a low temperature oxide (LTO), spin on glass (SOG), or titanium ARC (TiARC) is formed for the etch stop layer 110. The etch stop layer may be between about 1-5 nm and preferably 2-3 nm in thickness, although other dimensions may be employed. The neutral material layer 108 is employed as a film to generate self-alignment of DSA material.

Another OPL 112 is formed on the etch stop layer 110. In accordance with such higher resolution lithography, three lithographic layers are provided in the tri-layer stack overlying the etch stop layer 110. The tri-layer mask comprises OPL 112, an ARC 114 (e.g., SiARC) and a photoresist 116. The tri-layer stack may be provided for forming a template for DSA in accordance with the present principles. The OPL 112 is formed at a predetermined thickness to provide desired dimensions for the template. The photoresist 116 is formed on the ARC 114, exposed, cross-linked and developed by known methods to form a pattern of structures 116 having a minimum feature size achievable by lithography (i.e., a minimum feature size).

The role of the etch stop layer is to enable the etching of the second OPL layer 112 while stopping on the etch stop 110 without damaging the neutral layer 108. The neutral layer 108 would otherwise be damaged or destroyed by the reactive ion etch (RIE) conditions used to etch the OPL 112. The etch stop layer 110 can be removed with a mild wet etch chemistry, such as 1000:1 dilute HF, which will not damage the neutral layer 108). In useful embodiments, the OPL layers 104, 112 can be 50-100 nm in thickness, the neutral mat 108 can be 1-5 nm in thickness, resist layer 116 can be 50-150 nm in thickness and Si ARC layers 106, 114 can be 10-30 nm in thickness.

Figure 2:
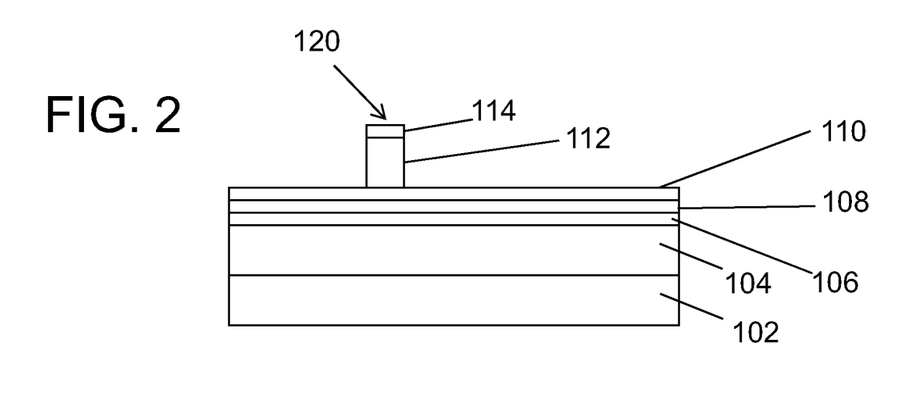
FIG. 2 is a cross-sectional view of the partially fabricated semiconductor device of FIG. 1 having the ARC and mask layer etched down to the etch stop layer in accordance with the present principles.

Referring to FIG. 2, the structures 116 are employed as an etch mask to etch the ARC 114 and the OPL 112. The etch includes an anisotropic etch, such as reactive ion etching (RIE) and etches down to the etch stop layer 110. While the etch process is anisotropic, the line thickness of a structure 120 may be, if desired, reduced from that of photoresist structure 116.

Figure 3:
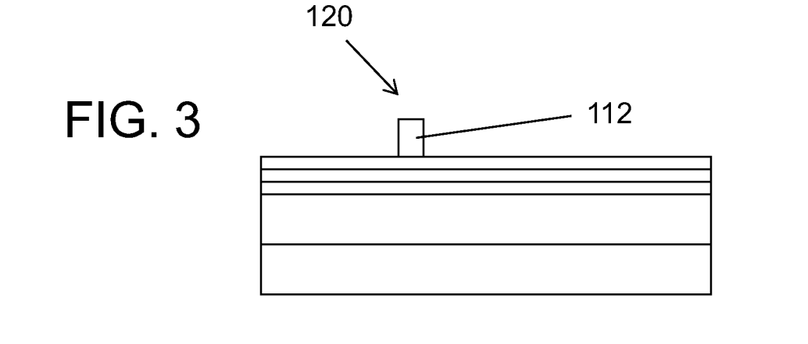
FIG. 3 is a cross-sectional view of the partially fabricated semiconductor device of FIG. 2 having the ARC removed and mask layer trimmed down in accordance with the present principles.

Referring to FIG. 3, a line trim etch may be performed to remove the ARC 114 from the surface of the OPL 112. The etch may include a continuation of the etch in FIG. 2 (RIE) or include a separate etch step (e.g., RIE with a new chemistry or different etch conditions). The ARC 114 is removed leaving a pattern of reduced size structures 120 from the material of OPL 112. These structures 120 may include a width of between about 10 nm and 20 nm with a height of greater than about 15 nm. The etch stop layer 110 continues to protect the neutral material layer 108.

Figure 4:
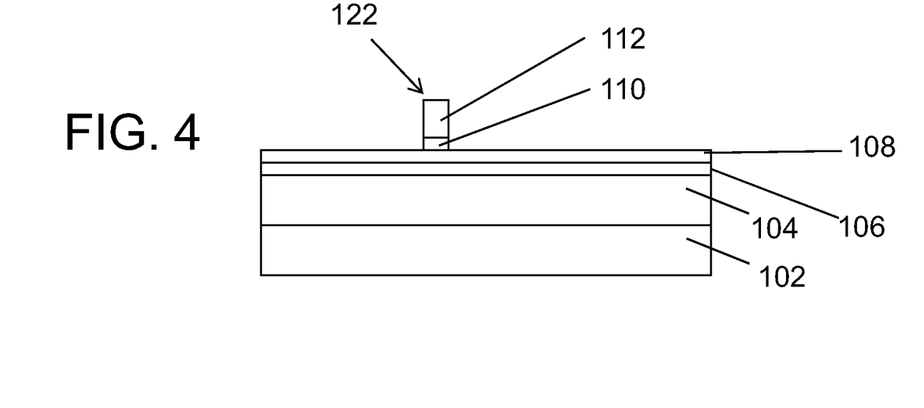
FIG. 4 is a cross-sectional view of the partially fabricated semiconductor device of FIG. 3 having the etch stop layer removed to expose the neutral material layer without significant damage to the neutral material layer, the mask layer forming a high-precision template in accordance with the present principles.

Referring to FIG. 4, the etch stop layer 110 is removed. The removal process of the etch stop layer 110 needs to be mild to protect the underlying neutral material layer 108. Damage to the neutral material layer 108 could result in poorly formed DSA structures. The removal of the etch stop layer 110 may include a wet etch using a mild etchant chemistry to remove the thin etch stop layer 110 without damage to the pattern formed by the material of OPL 112 and/or the neutral material layer 108. A portion of the etch stop layer 110 is protected from the etchant by OPL 112. This portion of the etch stop layer 110 may be employed as a release layer later in the process.

By employing a thin etch stop layer 110, isotropic etching issues due to the wet chemistry are thwarted to enable the structure to remain intact despite the etch. The mild etchant chemistry may include, e.g., diluted HF (DHF), chemical oxide removal (COR), a SiConi™ etch, standard clean 1 (SC1), etc. The DHF may be diluted in water at a ratio of between 800:1 to about 1200:1, preferably about 1000:1. Structures 120 (FIG. 3) are further diminished in size but only slightly and form a template 122 employed to position DSA materials to be applied in subsequent steps. The template 122 includes narrow lines (structures 120), e.g., line widths of 10-20 nm in OPL 112. By employing the tri-layer formation process, high resolution structures at accurate positions are employed to form the template 122 for DSA materials.

Figure 5:
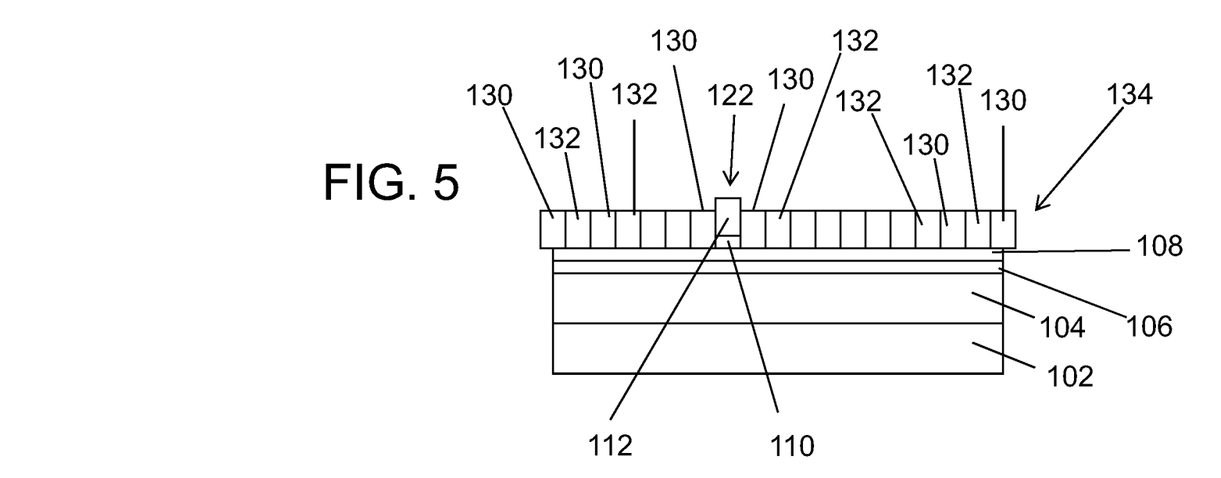
FIG. 5 is a cross-sectional view of the partially fabricated semiconductor device of FIG. 4 having a coating for directed self-assembly (DSA) disposed within the template in accordance with the present principles.

Referring to FIG. 5, a DSA material 134 is formed over the neutral material layer 108. In one embodiment, the DSA material 134 includes block copolymer (BCP), which may include polystyrene (PS), poly(methyl methacrylate) (PMMA) and/or other DSA materials. In accordance with one useful embodiment, the BCP includes a mixture of PS and PMMA. The DSA material 134 may be spun onto the neutral material layer 108 or otherwise be dispensed to coat the surface of the neutral material layer 108. One advantage of the present method includes the formation of structures for the template 122 that have a sufficient height to act as a partition between adjacent volumes of the DSA material 134.

In one embodiment, the DSA material 134 includes a lamellar forming PS-b-PMMA block copolymer (BCP) for directed self-assembly, which is grapho-epitaxially aligned by template 122 to create topographical patterns (e.g., simple line structures). The DSA material 134 is subjected to an anneal process. The anneal process may include a temperature of about 175 to 240 degrees C. for between about 2 to 5 minutes. The anneal process causes the PMMA and PS material to solidify into separate domains. The domains have a linear configuration or pattern with alternating regions 130, 132 of, e.g., PS and PMMA material. The regions 130 and 132 repeat across the allotted width provided between structures of the template 122. The formed pattern of regions 130 and 132 have a same width by selectively etching to remove one of the domains (130 or 132) relative to the other. A fine, high-resolution etch mask can be formed.

Figure 6:
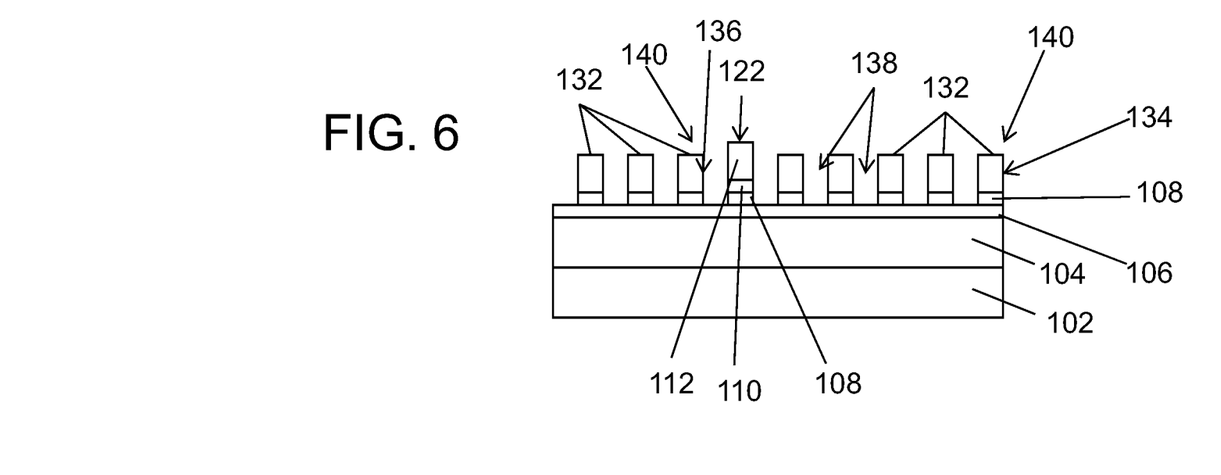
FIG. 6 is a cross-sectional view of the partially fabricated semiconductor device of FIG. 5 having one region of the coating removed to form a DSA template for further processing the device in accordance with the present principles.

Referring to FIG. 6, an anisotropic etch process, such as a RIE, is performed using a selective chemistry to remove one of the regions 130 and 132. The RIE may be employed to etch through the neutral material layer 108 down to the ARC 106. In the example shown in FIG. 6, regions 130 have been etched to leave gaps 138 between lines 140. Lines 140 include the DSA material 134 and the neutral material layer 108. These lines are employed as an etch mask to pattern underlying layers. In the example depicted in FIG. 6, the lines 140 are employed to etch the ARC 106, the OPL 104 and eventually the substrate 102. In this way, a well-defined, repeatable pitch pattern of lines is provided for which FINFETs can be formed. A DSA pattern line 136 is provided at a position adjacent to the template structure 122. In some embodiments, the etch stop layer 110 and/or the neutral material layer 108 may be employed as release layers to easily remove remaining materials thereon after etching underlying structures.

Figure 7:
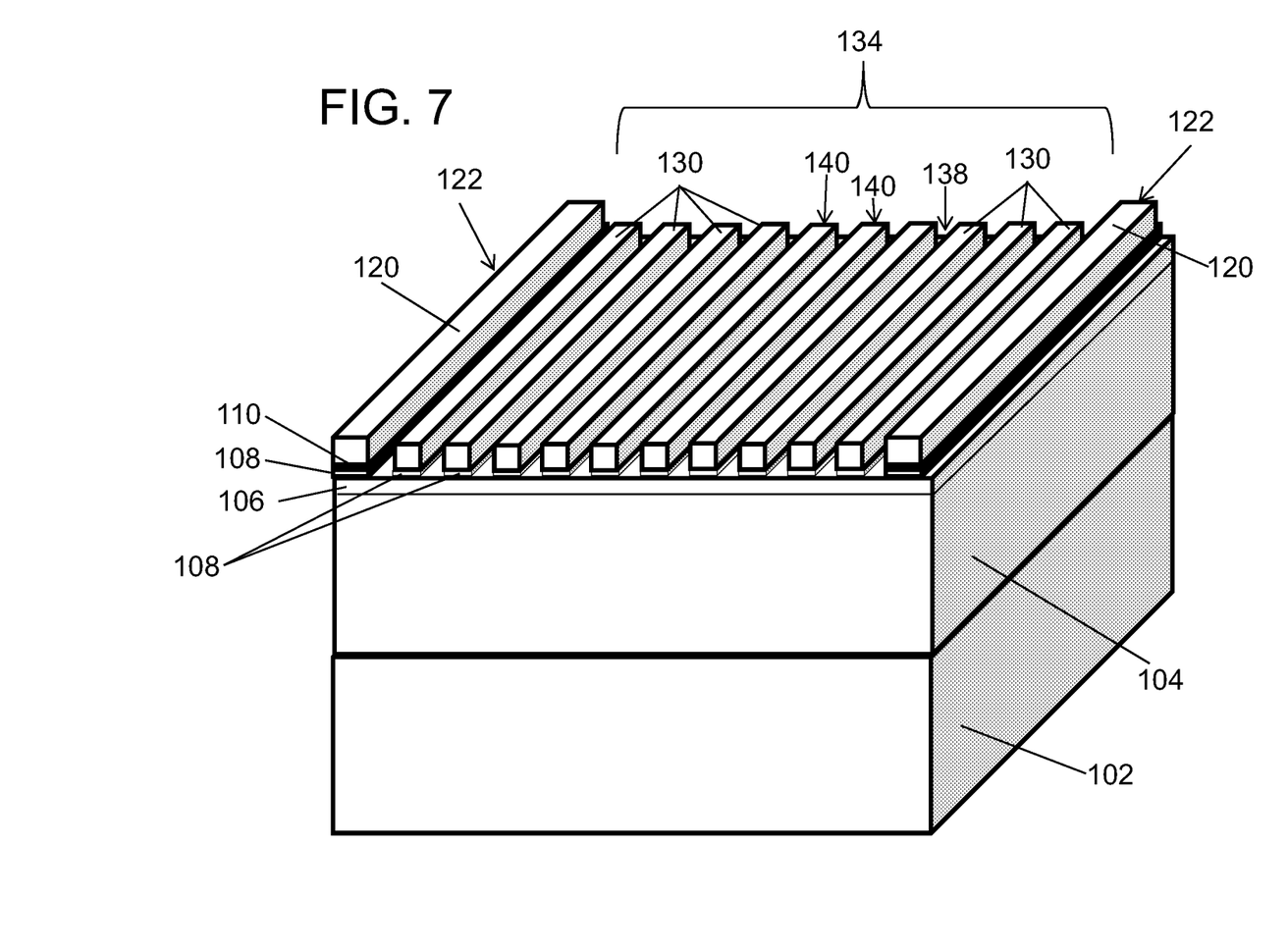
FIG. 7 is a perspective view of a DSA pattern and a high-precision template in accordance with the present principles.

Referring to FIG. 7, a perspective view shows the structures 120 of the template 122 for bounding the DSA material 134. The DSA material 134 has been annealed and etched to leave regions 130. The regions 130 will be employed in subsequent etching steps as an etch mask or doping mask to form structures for use in electronic devices. To be adequate for DSA processing, the lines 140 need to be formed using accurately dimensioned resist patterns (120). The resist patterns (120) need to include a height greater than about 15 nm and not have overly sloped lateral surfaces. The accurate dimensioning needed to provide feature sizes of 25 nm and less is not easily achievable using conventional lithography, and needs accurately defined template structures to ensure proper formation of regions 130 and 132 (FIG. 6) during the anneal process. The tri-layer approach as described above, provides these sharp, accurate features with sufficient height (aspect ratio) to achieve the 25 nm or smaller feature sizes.

It should be understood that variations of the tri-layer resist approach may be employed in accordance with the present principles. For example, a resist layer may be formed over the ARC and OPL layers, cross-linked and then trimmed to reduce its width using RIE, preferably selective to the ARC layer.

Figure 8:
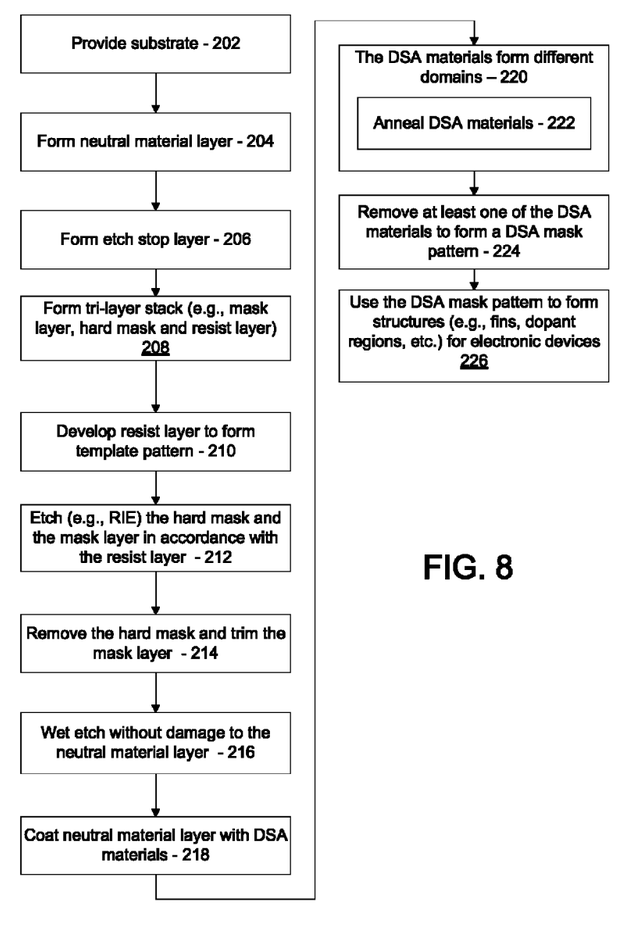
FIG. 8 is a block/flow diagram showing a method for forming a template for DSA processing in accordance with illustrative embodiments.

Referring to FIG. 8, a method for patterning a template and/or electronic structures using directed self-assembly (DSA) materials is described and shown. The flowchart and block diagrams in the Figures illustrate the architecture, functionality, and operation of possible implementations of methods according to various embodiments of the present invention. It should also be noted that, in some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a substrate is provided that may or may not include one or more layers thereon. In block 204, a neutral material layer or neutral mat is formed on the substrate or on the one or more layers. The one or more layers may include ARC layers, OPL layers, dielectric layers, etc. The neutral material layer may include three components, e.g., styrene (St), methyl methacrylate (MMA), and a cross-linker or an initiator with a hydroxyl functional group that can react with a substrate or surface on which the neutral layer is formed. Crosslinkers may include glycidyl methacrylate (GMA), 2-hydroxyethyl methacrylate (HEMA), benzocyclobutene (BCB) and/or azide ($N_3^-$). Processing temperature ranges from 130 degrees C. to 250 degrees C. may be employed and, process times may vary from 1 minute to 24 hours. Ultraviolet (UV) irradiation may be used in some cases to facilitate the process. Other neutral materials for the neutral material layer may include Si, $Si_3N_4$, $Ti_3N_4$, Al, Au, Pt, $SiO_2$, etc. or combinations thereof to provide a neutral surface or surfaces to induce oriented domains in PS-b-PMMA thin films.

In block 206, an etch stop layer is formed on the neutral mat. The etch stop layer includes a thickness of between about 1 and 5 nm and may be comprised of at least one of a low temperature oxide, a spun on glass and a Ti anti-reflection coating. Other thicknesses and materials may also be employed taking into account the etch selectivity relative to the layers lying adjacent to the etch stop layer.

In block 208, a tri-layer lithographic mask pattern stack is formed on the etch stop layer. In one embodiment, the tri-layer includes a mask layer (e.g., an optical planarization layer (OPL)), a hard mask (e.g., an anti-reflection coating (ARC)) and a resist layer. In block 210, the resist layer is developed using optical lithography to form a template pattern on the ARC. The DSA template preferably includes line width dimensions of 25 nm or less.

In block 212, the hard mask (ARC) and the mask layer (OPL) are reactive ion etched down to the etch stop layer in accordance with the template pattern to form a template structure. The RIE may include a fluorine etch with, e.g., $CF_4$, $CF_3H$, etc. for hard masks including SiARC, and an oxygen or $N_2/H_2$ mixture etch for the OPL. Typically carrier gases are used, such as nitrogen, helium, or argon in addition to the chemically reactive etch materials.

In block 214, the hard mask (ARC) is removed from the mask layer (OPL), and the template structure is trimmed to reduce a width of the template structure. This may include further RIE using a same process or a different chemistry/process than that of block 212. In block 216, a wet etch is performed to remove the etch stop layer without damaging the neutral mat and to form a DSA template from the mask layer (OPL). The wet etch may include wet etching with diluted HF diluted to between about 800:1 to about 1200:1. Other processes may include COR and/or SiConi™. Conventional processing methods lead to damage to the neutral layer, which resulted in the failure of the DSA self-aligned pattern. The neutral layer is very thin, and in most cases, if damaged, the neutral layer would probably be removed. Even if not removed, if the neutral layer were modified, surface properties would be such as to cause failure as an orientation layer for the DSA material. However, damage to the neutral layer is avoided in accordance with the present principles.

In block 218, the neutral mat is coated with the DSA materials such that the DSA materials are enclosed between structures of the DSA template. The DSA materials may include a block copolymer material. In block 220, different domains are formed within the DSA materials. The domains or regions may be formed within the DSA materials by annealing the DSA material in block 222. At least one of the different domains is removed to form a DSA mask pattern in block 224. The domain or region may be removed using a reactive ion etch process.

In block 226, the DSA mask pattern is employed to form structures for an electronic device. The structures for the electronic device may include, e.g., fins for fin field effect transistors. The fins may include a width of less than about 20 nm. The DSA mask pattern may be employed as a doping mask to dope the substrate or underlying layers. The DSA mask pattern may be employed as an etch mask to etch one of underlying layers or the substrate.

Having described preferred embodiments for a DSA grapho-epitaxy process with etch stop material (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for defining a template for directed self-assembly (DSA) materials, comprising:
    forming an etch stop layer on a neutral material;
    forming a mask layer on the etch stop layer;
    forming an anti-reflection coating (ARC) on the mask layer;
    patterning a resist layer using optical lithography to form a template pattern;
    reactive ion etching the ARC and the mask layer down to the etch stop layer in accordance with the template pattern to form a template structure;
    removing the ARC from the mask layer and trimming the template structure to reduce a width of the template structure; and
    performing a wet etch to remove the etch stop layer to permit the neutral material to form an undamaged DSA template for DSA materials.

2. The method as recited in claim 1, wherein the etch stop layer includes a thickness of between about 1 and 5 nm and is comprised of at least one of a low temperature oxide, a spun on glass and a Ti anti-reflection coating.

3. The method as recited in claim 1, wherein the neutral material includes a thickness of less than 5 nm.

4. The method as recited in claim 1, wherein the mask layer includes an optical planarization layer.

5. The method as recited in claim 1, wherein the template for DSA materials includes width dimensions of 25 nm or less.

6. The method as recited in claim 1, wherein performing the wet etch includes wet etching with diluted HF, diluted to between about 800:1 to about 1200:1.

7. The method as recited in claim 1, further comprising:
    coating the neutral material with the DSA materials such that the DSA materials are enclosed between structures of the DSA template.

8. The method as recited in claim 7, further comprising:
    annealing the DSA materials to form different domains within the DSA materials.

9. The method as recited in claim 8, wherein the annealing includes a temperature less than 230 degrees C.

10. The method as recited in claim 8, further comprising:
    removing at least one of the different domains within the DSA materials to form a DSA mask pattern.

11. The method as recited in claim 1, wherein the DSA materials include a block copolymer material.

12. A method for patterning electronic structures using directed self-assembly (DSA) materials, comprising:
    forming an etch stop layer on a neutral material over a substrate;
    forming a tri-layer lithographic mask pattern layer on the etch stop layer including an optical planarization layer (OPL), an anti-reflection coating (ARC) on the OPL and a resist layer on the ARC;
    developing the resist layer using optical lithography to form a template pattern on the ARC;
    reactive ion etching the ARC and the OPL down to the etch stop layer in accordance with the template pattern to form a template structure;
    removing the ARC from the OPL and trimming the template structure to reduce a width of the template structure;
    performing a wet etch to remove the etch stop layer to permit the neutral material to form an undamaged DSA template;
    coating the neutral material with the DSA materials such that the DSA materials are enclosed between structures of the DSA template;
    forming different domains within the DSA materials and removing at least one of the different domains to form a DSA mask pattern; and
    employing the DSA mask pattern to form structures for an electronic device.

13. The method as recited in claim 12, wherein the etch stop layer includes a thickness of between about 1 and 5 nm and is comprised of at least one of a low temperature oxide, a spun on glass and a Ti anti-reflection coating.

14. The method as recited in claim 12, wherein the neutral material includes a thickness of less than 5 nm.

15. The method as recited in claim 12, wherein the DSA template includes width dimensions of 25 nm or less.

16. The method as recited in claim 12, wherein performing the wet etch includes wet etching with diluted HF, diluted to between about 800:1 to about 1200:1.

17. The method as recited in claim 12, wherein employing the DSA mask pattern to form structures for an electronic device further comprises using the DSA mask pattern to dope the substrate.

18. The method as recited in claim 12, wherein employing the DSA mask pattern to form structures for an electronic device further comprises using the DSA mask pattern to etch one of underlying layers or the substrate.

19. The method as recited in claim 12, wherein the structures for the electronic device include fins for fin field effect transistors.

20. The method as recited in claim 19, wherein the fins include a width of less than 20 nm.

21. The method as recited in claim 12, wherein forming different domains within the DSA materials includes annealing the DSA material.

22. The method as recited in claim 12, wherein the DSA material includes a block copolymer material.

23. A method for patterning electronic structures using directed self-assembly (DSA) materials, comprising:
    forming an etch stop layer on a neutral material over a substrate;
    forming a tri-layer lithographic mask pattern layer on the etch stop layer including an optical planarization layer (OPL), an anti-reflection coating (ARC) on the OPL and a resist layer on the ARC;
    developing the resist layer using optical lithography to form a template pattern on the ARC;
    reactive ion etching the ARC and the OPL down to the etch stop layer in accordance with the template pattern to form a template structure;
    removing the ARC from the OPL and trimming the template structure to reduce a width of the template structure wherein the template is accurately formed to permit width dimensions of 25 nm or less;
    performing a wet etch to remove the etch stop layer to permit the neutral material to form an undamaged DSA template wherein the wet etching includes using diluted HF, diluted to between about 800:1 to about 1200:1;
    coating the neutral material with the DSA materials such that the DSA materials are enclosed between structures of the DSA template;
    forming different domains within the DSA materials and removing at least one of the different domains to form a DSA mask pattern; and
    employing the DSA mask pattern to form etch the substrate to form fins for fin field effect transistors.

24. The method as recited in claim 23, wherein the etch stop layer includes a thickness of between about 1 and 5 nm and is comprised of at least one of a low temperature oxide, a spun on glass and a Ti anti-reflection coating.

25. The method as recited in claim 23, wherein the fins include a width of less than 20 nm.

* * * * *